United States Patent [19]

Nakayama et al.

[11] Patent Number: 5,169,452
[45] Date of Patent: Dec. 8, 1992

[54] APPARATUS FOR THE SYNTHESIS OF DIAMOND-LIKE THIN FILMS

[75] Inventors: Masatoshi Nakayama; Kunihiro Ueda; Masanori Shibahara, all of Saku, Japan

[73] Assignee: TDK Corporation, Tokyo, Japan

[21] Appl. No.: 853,349

[22] Filed: Mar. 16, 1992

Related U.S. Application Data

[63] Continuation of Ser. No. 523,116, May 14, 1990, abandoned.

[51] Int. Cl.$^5$ .............................................. C23C 16/50
[52] U.S. Cl. .................................. 118/723; 118/729; 427/571; 427/577; 427/575
[58] Field of Search ............... 118/723, 729; 427/38, 427/47; 204/192.31, 298.05, 298.23, 298.24

[56] References Cited

U.S. PATENT DOCUMENTS

| 3,961,103 | 6/1976 | Aisenberg | 204/298.05 |
| 3,974,059 | 8/1976 | Murayama | 204/298.05 |
| 4,440,108 | 4/1984 | Little et al. | 118/723 |
| 4,902,572 | 2/1990 | Horne et al. | 204/298.05 |
| 4,974,544 | 12/1990 | Ohta | 118/723 |

FOREIGN PATENT DOCUMENTS

| 59-174507 | 10/1984 | Japan. | |
| 59-228932 | 12/1984 | Japan | 118/729 |
| 61-257471 | 11/1986 | Japan. | |
| 01234396 | 9/1989 | Japan. | |
| 01234397 | 9/1989 | Japan. | |
| 2-66167 | 3/1990 | Japan | 118/723 |

OTHER PUBLICATIONS

Bunshah et al, *Deposition Technologies for Films & Coatings* (Noyes, Park Ridge, N.J.) ©1982, pp. 288–289.
"Diamondlike Carbon Films Prepared by Charged Particles", Surface Chemistry, vol. 5, No. 109 (1984).

*Primary Examiner*—Shrive Beck
*Assistant Examiner*—Terry J. Owens
*Attorney, Agent, or Firm*—Fish & Richardson

[57] ABSTRACT

Diamond-like thin films having high uniformity and high crystallinity are produced by introducing a hydrocarbon material gas into a chamber, ionizing the gas, and depositing the ionized gas on a substrate. The gas is ionized by thermionic emission from two or more files of hot cathodes, each file having a plurality of filaments arranged at substantially uniform intervals in a linear or zigzag line configuration. Each file of hot cathodes is surrounded separately by an anode at a substantially uniform distance from a respective file of the filaments.

2 Claims, 5 Drawing Sheets

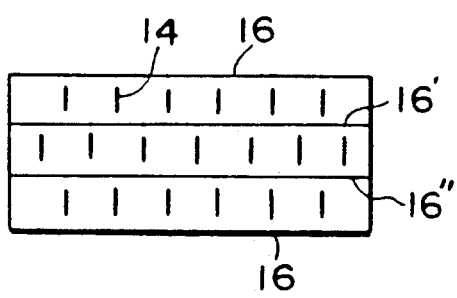
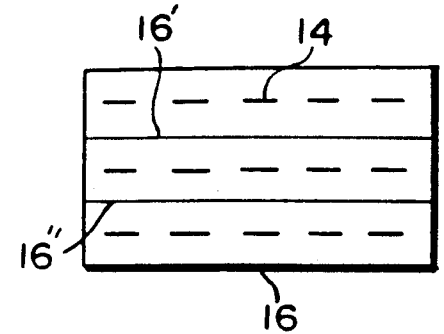
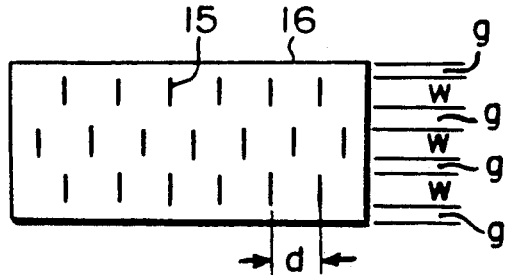

APPARATUS FOR THE SYNTHESIS OF DIAMOND-LIKE THIN FILMS

This is a continuation of application Ser. No. 07/523,116, filed May 14, 1990, now abandoned.

BACKGROUND OF THE INVENTION

1. Field of the Invention

The present invention relates to a synthesizing method for a diamond-like thin film and an apparatus for the same, and particularly, the present invention relates to a synthesizing method for a diamond-like thin film which has a comparatively wide surface area and an apparatus for the same. More particularly, it relates to a synthesizing method for a diamond-like thin film which shows good surface properties and a high crystallinity and an apparatus for the same.

2. Description of the Prior Art

There have been proposed many prior art techniques for synthesizing a diamond or a diamond-like thin film by means of a vapor-phase synthesis. However, these prior art methods have failed to synthesize a diamond-like thin film with a comparatively wide surface area. In the vapor phase synthesis, various methods have been proposed, typical ones being as follows.

a) Plasma method utilizing direct electric current, radio frequency (RF) or micro wave energy sources, b) Ionization evaporation method utilizing ionization of gas, c) Chemical vapor deposition method utilizing vapor phase reaction.

Almost all of these prior art techniques can not successfully synthesize a diamond-like thin film of good properties unless a substrate heated over 700° C. is used. For example, in the chemical vapor deposition method, a temperature of substrate from 700° to 1000° C. is required, and in the RF plasma method, a temperature of substrate above 700° to 1000° C. is required and in the micro wave plasma method, a temperature of substrate above 700° C. is required. It is well known that these methods are able to syntheze diamond-like thin films of good property. These results are disclosed in, for example, "Surface Chemistry" Vol. 5, No. 108 (1984) pp. 108-115.

However, the requirement for substrate of such high temperature disclosed in the aforementioned prior art is a severe hindrance to a trial for increasing the surface area of the substrate for a diamond-like thin film, because a substrate of a wider surface area requires more energy to heat itself above the temperature of 700° C.

On the other hand, there have been proposed other prior art techniques for the vapor phase synthesis to synthesize a diamond-like thin film of good properties, utilizing a substrate at comparatively low temperatures. A substrate heated to less than 400° C. for example is utilized in sputtering method, ion beam evaporating method, DC plasma method and ionization evaporating method. They are suitable for saving energy. However, these prior art methods which utilized a substrate at such a low temperature have failed to provide any adequate manufacturing process and means capable of providing a diamond-like thin film with a wider surface area yet.

The present invention relates to an improvement in the ionization evaporation method among the aforementioned prior art methods. In this method, in order to synthesize a diamond-like thin film, one or more material gases which contain carbon atoms are introduced into a vacuum chamber and are ionized by means of various ionizing means such as arc discharge between a cathode and an anode or thermionic emission between a hot cathode filament and an anode. Then, the ionized carbon-containing particles are accelerated by an electric field as a stream of ions and are deposited on a substrate to form a diamond-like thin film. The aforesaid material gas or gases may include hydrocarbon gases or gases capable of producing hydrocarbons from decomposition or from reaction. Herein, the term "hydrocarbon" means any of saturated hydrocarbons, such as methane, ethane and propane, and unsaturated hydrocarbons such as ethylene, propylene and acetylene. The material gas capable of producing hydrocarbon from decomposition, may be selected out of alcohols, such as methyl alcohol and ethyl alcohol or out of ketones such as acetone and methyl ethyl ketone. The material gas capable of producing hydrocarbon gas from reaction, may be consisted of a mixture of gas which contains hydrogen atoms such as water and of a gas which contains carbon atoms such as carbon monoxide or carbon dioxide. The material gas may contain at least one of oxygen gas, nitrogen gas and inert gas such as helium, neon and argon or the like.

The processes of synthesizing the diamond-like thin film by means of this ionization evaporation method were disclosed in the prior art such as Japanese Patent Publication for Application "Kokai" No. 174507/1983, Japanese Patent Application No. 59376/1988 and No. 59377/1988. The ionization evaporation method is well known as having a high deposition rate, and the diamond-like thin film which was made by means of the method had the features of good surface property, high degree of hardness, high conductivity and high index of refraction. Furthermore, the resulting diamond-like thin film need not any surface finishing. In this method for synthesizing a diamond-like thin film with a wider surface area, it requires filaments of a wide surface area as a hot cathode. However, filaments are generally thin and linear, and no filament has been designed to be with wide surface. Instead of the wide surface filaments, the inventors of the present invention tried to arrange uniformly a plurality of filaments on two dimensional coordinates, and to arrange one anode surrounding the whole array of filaments at a predetermined distance from the filaments. The filaments for this trial were selected from linear one or U-shaped one which has pin point top end. However, this trial did not succeed in synthesizing any diamond-like thin film of a large surface area which showed good property throughout the surface area. The trial will be explained later as the comparatives in FIGS. 6 and 7.

PURPOSE OF THE INVENTION

The object of the present invention is to provide a synthesizing method for a diamond-like thin film with a wide surface area and an apparatus for carrying out the method which is attained by the improvement of the ionization evaporation method.

SUMMARY OF THE INVENTION

The above stated object is accomplished in accordance with one aspect of the present invention by a method and apparatus for synthesizing a diamond-like thin film which utilizes steps of introducing a hydrocarbon gas or a gas capable of producing a hydrocarbon gas from decomposition or from reaction into a vacuum chamber, ionizing the gas and depositing the ionized gas on a substrate. The method and apparatus are characterized by providing in the chamber at least one elongated hot cathode filament for the ionization consisting of one or more elongated filaments, preferably coiled filaments, which are arranged in a linear line or a zigzag line in a predetermined direction, and at least one anode which surrounds each filament and means to apply a heating electric current to said filament.

Instead of utilizing said long or elongated filament, the object of the present invention is also accomplished in accordance with another aspect of the present invention by a method and apparatus for synthesizing a diamond-like thin film, which includes the steps of introducing a hydrocarbon material gas or a gas capable of producing a hydrocarbon gas from decomposition or from reaction into a vacuum chamber, ionizing the gas and depositing the ionized gas on a substrate, which is characterized by providing in the chamber a plurality of hot cathodes filaments arranged at substantially uniform intervals in a linear or zigzag line in a predetermined direction, an anode surrounding the plurality of the filaments at a predetermined distance, and means to apply a heating electric current to said filaments.

The object of the present invention is also accomplished in accordance of a further aspect of the present invention by a method and apparatus for synthesizing diamond-like thin film which utilizes a plurality of files of hot cathode filaments, each file consisting of a plurality of the hot cathodes filaments of the aforesaid linear or zigzag configuration and anodes arranged to surround respective files of the filaments.

By this linear arrangement of single or plural hot cathode filaments, an anode can be arranged to surround said filaments at a generally uniform distance. In the case of utilizing a plurality of files of hot cathode filaments, anodes are arranged to surround respective files of filaments. By this configuration of a generally uniform distance between hot cathode filaments and anodes, a uniform electric field by an applied voltage across them is realized, so that ionization of hydrocarbon with thermionic emission from the hot cathode filaments can be uniformly attained. Because of these facts, synthesis of a diamond-like thin film with a wide surface area of good property can be realized.

Furthermore, the present invention has another aspect which is a method and apparatus for synthesizing a diamond-like thin film characterized in that said hydrocarbon material gas or gas capable of producing hydrocarbon gas from decomposition or from reaction is introduced through single or plural nozzles which are designed to be a slit arranged nearby said hot cathode filaments to realize more uniform ionization.

In addition, the present invention has a further aspect which is a method and apparatus for synthesizing a diamond-like thin film, characterized by comprising driving means for substrate in the direction perpendicular to said predetermined direction of arrangement or files of the hot cathode filaments. By this aspect of the present invention a continuous synthesizing of the diamond-like thin film is realized.

In yet other method for synthesizing the diamond-like thin film with a wider surface area of good property, scanning of a plasma ion beam of ionized hydrocarbon on a stationary substrate by deflection of the beam perpendicular to the direction of arrangement of the hot cathode filaments can be employed. A magnetic field for this deflection can be generated by a permanent magnet or electromagnet adapted to generate the magnetic field which has a direction perpendicular to that of acceleration of the ion beam.

The superior features of the diamond-like thin film such as good surface property attained by the ionization evaporation method can be maintained in the diamond-like thin film of a wider surface area according to the present invention.

The diamond-like thin film provided by the present invention is applicable to the usage where a high wear resistance is required over a wide surface area such as a covering or a coating for magnetic storage disks, VTR cylinders and molds for plastics.

BRIEF DESCRIPTION OF FIGURES

FIG. 7 illustrates an ichnographic view of another example of the ionizing means disclosed in the prior art.

FIGS 9, 10, 11, 12 and 13 illustrate plane views of yet further examples of the ionizing means to be utilized in the present invention, which are cut along the line A—A in FIG. 1.

DETAILED DESCRIPTION OF THE INVENTION

The present invention will be described further with reference to the preferred embodiment. In the following embodiment, description is given only for the examples and it should be understood that various variations may be made by one skilled in the art without departing from the spirit and the scope of the present invention.

The ionization evaporation method on which the present invention relies is disclosed, e.g., in Japanese Patent Application No. 59376/1988 and No. 59377/1988. The technology and the manufacturing conditions disclosed in the above mentioned prior art of the method for synthesizing the diamond-like thin film and the apparatus for the same, are applicable to the embodiment of the present invention.

DESCRIPTION OF THE PREFERRED EMBODIMENT

Brief description of the Apparatus

Figure 1:
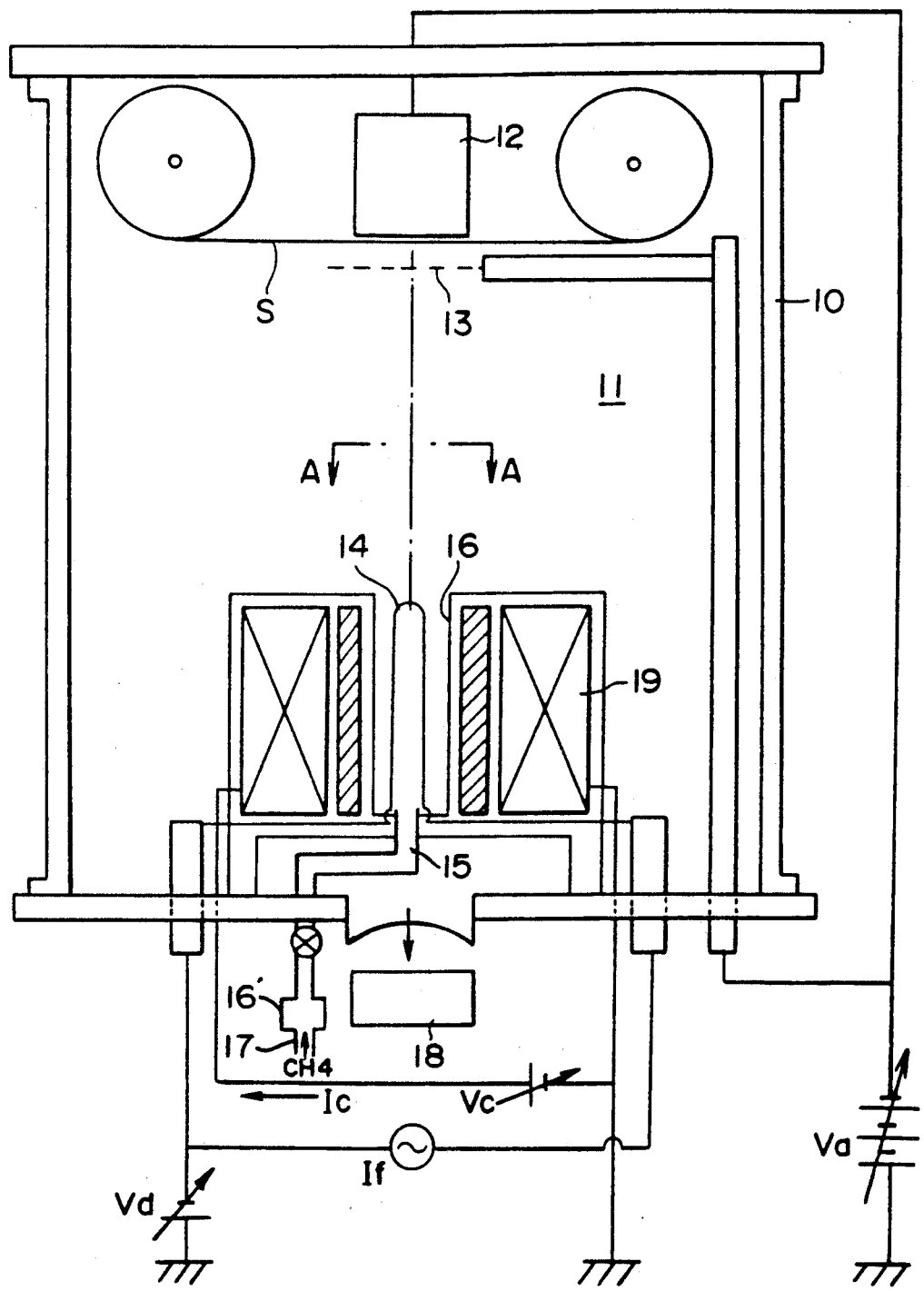
FIG. 1 illustrates a cross sectional view of one example of the apparatus which is employed for synthesizing a diamond-like thin film of the present invention.

One example of the preferred embodiment for the apparatus to synthesize the diamond-like thin film of the present invention is shown in FIG. 1. Except for the ionizing means of the apparatus, the apparatus is quite the same as the apparatus which is disclosed in the aforementioned prior art such as Japanese Patent Application Public Disclosure "Kokai" No. 174507/1983, and Japanese Patent Application No. 59376/1988 and No. 59377/1988. Referring to FIG. 1, the numeral 10 denotes a vacuum vessel and 11 denotes a chamber connected to an evacuating system 18 so that the chamber is evacuated to a high vacuum at a pressure of about $10^{-6}$ Torr. An electrode 12 is positioned at the back of a substrate S which is wound in roll and driven to a predetermined direction by a suitable driving means.

In this example, a predetermined voltage "Va" is applied to the electrode 12. A grid 13 is utilized to accelerate ions. A hot cathode filament 14 is heated by an AC power source "If" for thermal electron emission, which is charged negative with an applied voltage. The numeral 15 is an inlet nozzle for the hydrocarbon material gas. An anode 16 is arranged to surround the filament 14, where charge "Vd" is applied across the anode 16 and the filament 14. An electromagnetic coil 19 which generates a magnetic field adapted to contain ionized gas, is arranged to surround the filaments 14, the anode 16 and the inlet 15. Through adjustment of the voltages "Vd" and "Va" and the electric current for the magnet 19, various diamond-like thin films of different qualities can be easily synthesized.

In FIG. 1, a plasma excitation chamber 16' is arranged at the inlet passage 17 for the hydrocarbon material gas. The efficiency of the ionizing means is improved by utilization of this excitation chamber. The plasma excitation is accomplished by applying high energy waves such as micro wave, radio frequency wave (RF wave), radio active ray or ultra violet ray.

Figure 2:
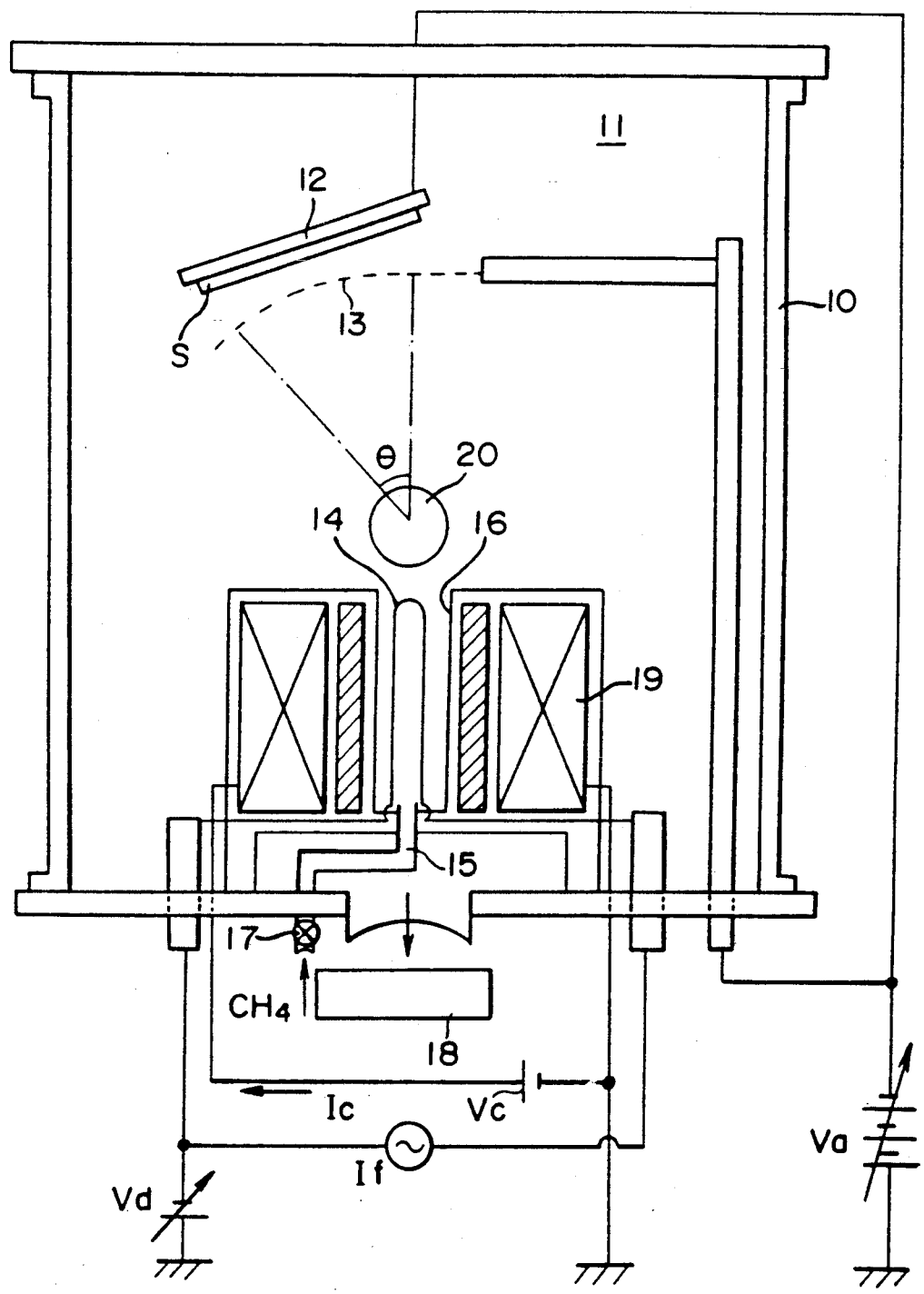
FIG. 2 illustrates a cross sectional view of another example of the apparatus which is employed for synthesizing a diamond-like thin film of the present invention.

In the apparatus illustrated in FIG. 1, a magnet 20 shown in FIG. 2 may be additionally employed by arranging it in a position above the filament 14 so as to deflect the plasma ion beam. In this embodiment, the intensity of the magnetic field of the magnet 20 is constant and the direction of the magnetic field is perpendicular to the direction of the ion beam. Thus, a predetermined deflection angle $\theta$ for the specified ion such as $CH_3^+$ or $CH_4^+$ can be obtained. For the ions which have lighter weight than the aforementioned specified ions, hydrogen, for example, the deflection angle by the applied magnetic field is larger.

In contrast, for the heavier ions such as oligomer ions, the deflection angle is smaller. In addition, the particles without any charge are not affected by the applied magnetic field and go straight. Accordingly, a selection of ions can be attained with the employment of a mask in a position on the axis of the straight ion beam to realize that only ions for high crystallinity are deposited on the substrate S.

Another example of the apparatus to be employed for the preferred embodiment is shown in FIG. 2. The apparatus itself in the figure is similar to the apparatus disclosed in the aforementioned Japanese Patent Applications. In this apparatus, the substrate S is arranged in a slant position with respect to the axis of the filaments and is supported by an electrode 12 at the back side of itself. A magnet 20 is so arranged to scan the ion beam by means of a magnetic field in the direction of the axis of filaments. The scanning angle of the plasma ion beam is increased at a uniform rate with uniform increase in the intensity of the magnetic field or vise versa. Thus, the uniform beam distribution for a wide surface area of the same specified ion can be attained.

BRIEF DESCRIPTION OF SYNTHESIZING METHOD

Hereinafter, a description of the synthesizing method for a diamond-like thin film will be given in detail in accordance with the apparatus of FIG. 1. The chamber 11 is evacuated to $1 \times 10^{-6}$ Torr and then a hydrocarbon material gas is supplied at the predetermined flow rate to maintain the chamber in a predetermined gas pressure, for example 0.1 Torr, from an inlet 15 by means of valve operation of the inlet passage 17. The material gas may be composed of methane or a mixture gas of methane and hydrogen, or a mixture of them and a carrier gas such as Ar, He or Neon. On the other hand, an AC current "If" is supplied to the plural cathode filaments 14 and a voltage "Vd" is also applied across the filaments 14 and the anode 16 to generate a discharge. The particles of the methane gas which are introduced through the inlet 15, are thermally decomposed and collide with thermoelectrons from the filaments. Then, they are dissociated into cations and electrons. The dissociated electrons collide continuously with other particles which are decomposed thermally. The material methane gas is thus converted into cations which are thermally decomposed with repetition of the above processes under the containment by the applied magnetic field from the electromagnet coil.

The cations are directed to the electrode 12 and the grid 13 by means of the potential of electric field formed by the applied voltage "Va". They are accelerated to and deposited onto the substrate S to form the diamond-like thin film. In this embodiment, the substrate S moves slowly during the process of deposition to attain the wider surface area. The film with much better properties can be realized by the ion selection utilizing a magnetic field from the aforesaid magnet 20.

Further information on the voltage, current, temperature and other conditions for manufacturing are disclosed, e.g., in the aforementioned Japanese Patent Applications and other prior art.

The evaporating process for the apparatus in FIG. 2 is essentially the same as that of in FIG. 1, with only difference that the substrate S is fixed and the plasma ion beam scanning is employed by means of variable magnetic field from the electromagnet 20.

In the example of the aforementioned apparatus illustrated in FIG. 1 and 2, the ionizing means are novel and characterize the present invention, which will now be explained in detail.

More specifically, to accomplish the object of the present invention, the present invention is characterized by (1) utilizing elongated single or plural hot cathode filaments or a file, or plural files of a plurality of filaments more than one and (2) establishment of substantially uniform distance between said filaments and the anodes which surround respective files of said filaments.

DETAILED DESCRIPTION OF THE IONIZING MEANS

Hereinafter, among embodiments of the ionizing means of the present invention, an embodiment which employs one or more elongated filaments, each arranged in a single line will be explained in detail.

Figure 3:
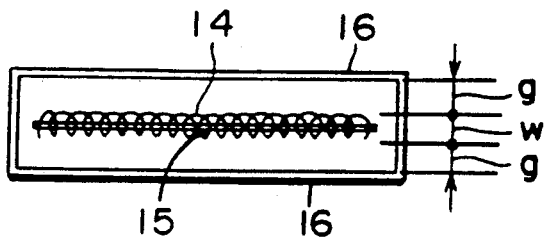
FIG. 3 illustrates a plane view of one example of the ionizing means to be utilized in the present invention which is cut along the line A—A in FIG. 1.

FIG. 3 illustrates a plane view of an example of ionizing means to be utilized in the present invention, which is cut along the line A—A in FIG. 1. An elongated coiled filament 14 for the hot cathode is arranged in a line and has a predetermined width "w". An anode 16 is arranged to surround the filament 14. The anode 16 has two sides 16 in parallel relation with the elongation of the filament 14 at a predetermined distance "g" from the filament. An inlet which is designed to be a slit or a nozzle 15 is arranged at bottom of the center portion of the elongated filament 14 to feed a hydrocarbon material gas.

It was testified by the following examples of the present invention that the diamond-like thin film deposited on the surface of a substrate using the ionizing means of this embodiment has a uniform film thickness, a uniform surface property and a uniform crystallinity along the direction of center line of the filament. They can be attained from an appropriate selection from the combination of the distance between the substrate and the ionizing means, the width "w" of the filament, the distance "g" between the filament and the anode.

Figure 4:
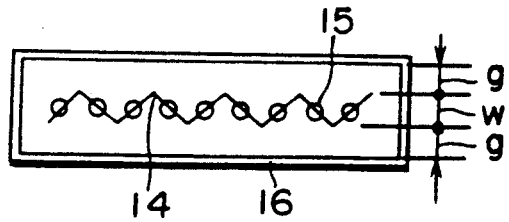
FIG. 4 illustrates a plane view of another example of the ionizing means to be utilized in the present invention.

FIG. 4 illustrates a plane view of another embodiment of the ionizing means according to the present invention. In this embodiment, the coiled filament 14 has an arrangement of a zigzag configuration with a predetermined width "w". Feed nozzles 15 of a hydrocarbon material gas are arranged at the bottom portion of the center line of the filament.

It was also testified that the deposited diamond-like thin film using this embodiment of the ionizing means has a uniform film thickness, a uniform surface property and a uniform crystallinity along the direction of center line of the filament.

Figure 5:
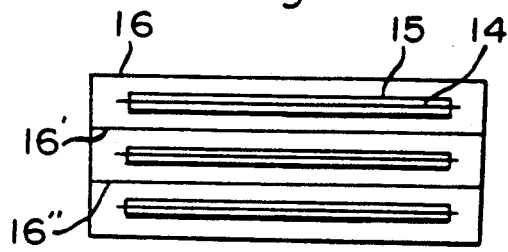
FIG. 5 illustrates a plane view of a further example of the ionizing means to be utilized in the present invention.

FIG. 5 illustrates a plane view of a further example of the ionizing means of the present invention. In this embodiment, it has three files of the ionizing means each of which is similar to that illustrated in FIG. 3. Each file of filaments is surrounded by an anode 16, 16' or 16" having parallel sides and the distances between the hot cathode filaments and the anodes are at a substantially uniform value.

Hereinafter, the comparative examples for the present invention will be briefly given with the illustration of FIG. 6 and 7. In the comparative examples, many U-shaped filaments were discretely and uniformly arranged with a predetermined spacing "d", and an anode 16 was arranged outside of the whole array of the filaments at a predetermined distance "g" as shown in the figures. However, this arrangement failed to achieve the uniformity of the thickness and crystallinity of the manufactured film, and its properties were poor. By this comparison, it was testified that the uniform setting of distance between the hot cathode filaments and the anode or anodes in the predetermined value is very important.

Hereinafter, the example of the manufacturing process will be given briefly.

EXAMPLE 1

A diamond-like thin film was made by the apparatus of FIG. 1 by utilizing the ionizing means of FIG. 3. The vacuum vessel 10 was evacuated to a pressure of $1 \times 10^{-6}$ Torr and then methane gas was introduced into the vessel to attain a pressure of the vessel of 0.1 Torr. Thereafter, a discharge from the hot cathode filament was generated. The flux density from the electromagnet 19 was set at 400 Gauss and the voltage "Va" applied to the substrate S was $-300$ V and the temperature of the substrate was 200° C. Applied current for the filament 14 was 25 A. Dimensions for filament in FIG. 3 were w=3 mm, g=8 mm. As for the substrate S, a 20 $\mu$m Al thin film was employed with a moving velocity of 40 mm/hr.

The diamond-like thin film was manufactured under the conditions of If=175 A, Vc=30 V and Vd=$-30$ V with the layer thickness of 0.8 $\mu$m. It had a Vickers hardness of 6500 kg/mm$^2$.

EXAMPLE 2

A diamond-like thin film was manufactured on a polyimide substrate of 150 $\mu$m and Vickers hardness of 5500 kg/mm$^2$. It was testified by Example 2, that the synthesizing method provided by the present invention could be applicable to substrates of plastic films.

COMPARATIVE EXAMPLE 1

Figure 6:
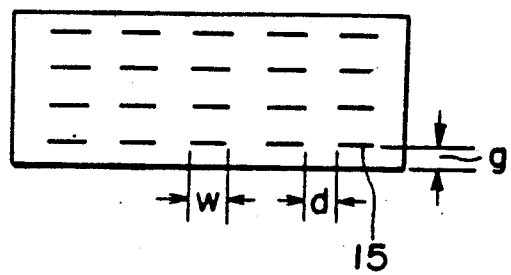
FIG. 6 illustrates a plane view of an example of the ionizing means disclosed in the prior art.

A diamond-like thin film was manufactured by the same synthesizing method and apparatus of Example 1 except that in this example the ionizing means of filaments arranged in FIG. 6 was utilized. The manufacturing conditions were d=2 mm, w=10 mm, g=8 mm, If=475 A, Va=$-300$ V and Vd=$-30$ V were settled and the others were similar to those in Example 1. The resulting film had varying layer thickness and Vickers hardness along the centerline, that is, 0.2 $\mu$m and 800 kg/mm$^2$ in the central portion of the substrate, 0.5 $\mu$m and 2000 kg/mm$^2$ in the middle portion adjoining the central one and 1 $\mu$m and 2500 kg/mm$^2$ in the outer portions adjoining the middle portion. By this comparison, it was testified that the thickness and the hardness of the manufactured diamond-like thin film could not be uniformly assured due to the existence of difference in the distance between the filaments and the anodes.

Another example of the ionizing means according to the present invention will be explained, which has at least one file or array of hot cathode filaments.

Figure 8:
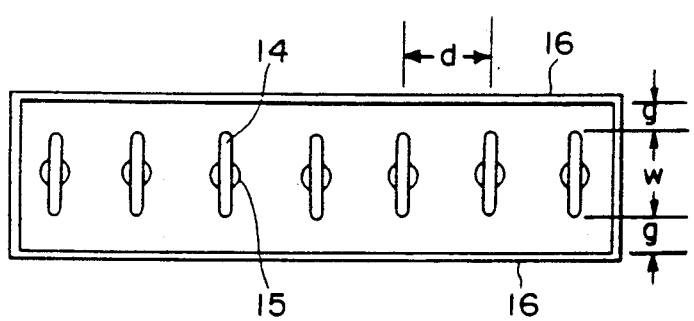
FIG. 8 illustrates a plane view of a further example of the ionizing means disclosed in the prior art.

In FIG. 8, a plurality of U-shaped hot cathode filaments 14 are arranged at predetermined uniform intervals "d" with the direction of each filament along a plane including both legs of each U-shaped filament is perpendicular to that of the line of arrangement of the filaments. An anode 16 is arranged to surround the filaments and having both sides in parallel relation with the file of the filaments, inlets 15 for a hydrocarbon material gas are each arranged at the bottom of the center portion of the each filament.

It was testified that the uniformity of the film thickness, the surface property and the crystallinity along the direction of the arrangement of the filaments of the resulting diamond-like thin film could be attained by an adequate combination of the distance between the substrate and the ionizing means, the width "w" of the filament, the distance "d" between the filaments, the distance "g" between the filaments and the anode, which will be described further below.

Figure 9:
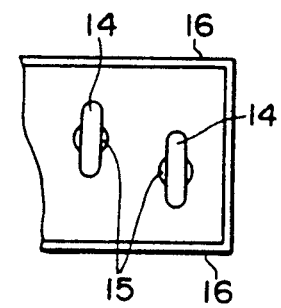

FIG. 9 illustrates another example of the ionizing means according to the present invention. In this embodiment, U-shaped filaments 14, which are similar to those shown in FIG. 8 have an arrangement of a zigzag configuration at predetermined uniform intervals. Feed nozzles 15 for a hydrocarbon gas are each arranged at the bottom of the center portion of each filament with the same zigzag configuration to the filaments. It was testified that uniformity of the film thickness, the surface property and the crystallinity along the direction of the arrangement of the filaments of the resulting diamond-like thin film could be attained.

Figure 10:
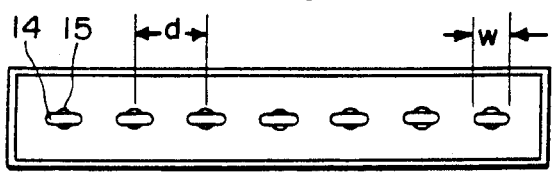

FIG. 10 is a plane view of a further example of the ionizing means of the present invention, which is an improved example over that in FIG. 8. In this embodiment, a plurality of U-shaped hot cathode filaments 14 are arranged at a predetermined uniform intervals "d" with each direction of filaments being parallel to the line of arrangement of the filaments.

Figure 11:
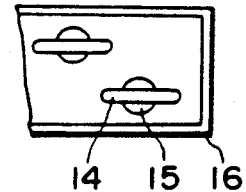

FIG. 11 is a plane view of a yet further example of the ionizing means of the present invention, which is an improvement over that of FIG. 9. In this embodiment, a plurality of U-shaped hot cathode filaments 14 are arranged in a zigzag configuration with a predetermined width "w" similar to FIG. 4.

FIG. 12 illustrates a yet further example of the ionizing means of the present invention. In this embodiment, it has three files of hot cathode filaments, each of which is similar to that illustrated in FIG. 8, and the arrangement of a plurality of filaments in this manner can be generally applicable to other embodiments. The distance between the hot cathode filaments and anodes are uniform due to the arrangement of anodes 16, 16' and 16" surrounding corresponding files of the hot cathode filaments.

FIG. 13 illustrates yet another example of the ionizing means of the present invention. In this embodiment, it has three files of the ionizing means, each of which is similar to that illustrated in FIG. 10, and the arrangement of plurality of ionizing means in this manner can be generally applicable to other embodiments. The distance between hot cathode filaments and anodes are uniform due to the arrangement of anodes 16, 16' and 16" surrounding corresponding files of the hot cathode filaments.

EXAMPLE 3

A diamond-like thin film was made by the apparatus of FIG. 1 using the ionizing means of FIG. 8. The vacuum vessel 10 was evacuated to a pressure of $10^{-6}$ Torr and then methane gas was introduced into the vessel to maintain the pressure of the vessel under 0.1 Torr. Thereafter, a discharge from the hot cathode filaments was generated. The flux density from the electromagnet 19 was set at 400 Gauss and the charged voltage "Va" to the substrate and the temperature of it were $-300$ V and 200° C. respectively. The current for the filament 14 was 25 A. Dimensions for filament in FIG. 8 were $d=2$ mm, $w=10$ mm, g 8 mm. As for the substrate S, 20 $\mu$m thickness Al thin film was employed with a moving velocity 40 mm/hr. Other conditions for manufacturing were If=175 A, Vc=30 V and Vd= $-30$ V and deposited film was obtained with a layer thickness of 0.8 $\mu$m. It had a Vickers hardness of 6500 kg/mm$^2$.

EXAMPLE 4

A diamond-like thin film was deposited on a polyimide substrate of 150 $\mu$m thickness in the same conditions as in Example 3. The diamond-like thin film was obtained with a layer thickness of 0.6 $\mu$m and a Vickers hardness of 5500 kg/mm$^2$. It was testified by this example, that the synthesizing method provided by the present invention could be applicable to substrates of plastic films.

COMPARATIVE EXAMPLE 2

A diamond-like thin film was manufactured by the same synthesizing method as Example 1 except that the ionizing means of FIG. 7 was employed. The manufacturing conditions were similar to the Example 1 except that the deflection magnet is not used and it was aimed to synthesize a diamond-like thin film of 3 $\mu$m thickness. For the synthesizing conditions, If=475 A, Va= $-300$ V and Vd= $-30$ V were set and others were similar to those of the Example 1. The resulting film had varying layer thickness and Vickers hardness of 0.2 $\mu$m and 800 kg/mm$^2$ respectively in the central portion of the substrate, 0.5 $\mu$m and 2000 kg/mm$^2$ in the middle portions adjoining the central one and 1 $\mu$m and 2500 kg/mm$^2$ in the outer portions adjoining the middle portion. By this comparison, it was also testified that the thickness and the hardness of the manufactured diamond-like thin film could not be assured in constant due to the difference in the distance between filaments and anodes.

As was shown in the above examples and comparatives, the synthesizing method and the apparatus for the same incorporated with the present invention can successfully synthesize a diamond-like thin film with wide surface area which is characterized by uniform layer thickness and higher hardness.

What is claimed is:

1. A synthesizing apparatus for a diamond-like thin film by introducing a hydrocarbon material gas or a material gas capable of producing a hydrocarbon gas from decomposition or from reaction to a vacuum chamber, ionizing the gas and depositing the ionized gas on a substrate, characterized by comprising:

a) two or more files of hot cathodes, each file of which consists of a plurality of filaments arranged at substantially uniform intervals in linear or zigzag line in a predetermined direction, b) two or more anodes, each said anode surrounding a respective one file of said two or more files of said plurality of filaments at a substantially uniform distance from said respective one file of the filaments, c) means to supply a positive voltage to the anodes relative to said hot cathodes, d) means to supply a heating electric current to said plurality of filaments, e) means to supply the material gas to each of said filaments, and f) means to provide a magnetic field surrounding said hot cathode.

2. A synthesizing apparatus for a diamond-like thin film according to claim 1, further comprising a plurality of nozzles, each of which is arranged near said plurality of filaments, from which said hydrocarbon material gas or material gas capable of producing hydrocarbon gas from decomposition or from reaction is introduced.

* * * * *

UNITED STATES PATENT AND TRADEMARK OFFICE
CERTIFICATE OF CORRECTION

PATENT NO. : 5,169,452

DATED : December 8, 1992

INVENTOR(S) : Masatoshi Nakayama et al

It is certified that error appears in the above-identified patent and that said Letters Patent is hereby corrected as shown below:

Column 9, line 46, insert --=-- after "g" before "8".

Signed and Sealed this

Seventh Day of December, 1993

Attest:

BRUCE LEHMAN

Attesting Officer

Commissioner of Patents and Trademarks